(12) United States Patent
Youm et al.

(10) Patent No.: US 6,233,171 B1
(45) Date of Patent: May 15, 2001

(54) SUPERCONDUCTING MAGNETORESISTIVE MEMORY ELEMENT USING CONTROLLED EXCHANGE INTERACTION

(75) Inventors: Dojun Youm, Kaist (KR); Malcolm R. Beasley, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/422,135

(22) Filed: Oct. 20, 1999

Related U.S. Application Data
(60) Provisional application No. 60/104,899, filed on Oct. 20, 1998.

(51) Int. Cl.[7] .................................................... G11C 11/00
(52) U.S. Cl. ........................... 365/158; 365/171; 365/173
(58) Field of Search ..................................... 365/158, 171, 365/173, 148, 160; 428/694 ML

(56) References Cited

U.S. PATENT DOCUMENTS

| | | | | |
|---|---|---|---|---|
| 5,432,734 | * | 7/1995 | Kawano et al. ...................... | 365/158 |
| 5,728,481 | * | 3/1998 | Kasai et al. ........................... | 428/694 |
| 5,930,165 | * | 7/1999 | Johnson et al. ...................... | 365/171 |

* cited by examiner

Primary Examiner—David Nelms
Assistant Examiner—David Lam
(74) Attorney, Agent, or Firm—Luman Intellectual Property Services, Inc.

(57) ABSTRACT

A magnetoresistive memory element utilizing an enhanced proximity effect of ferromagnetic layers (ML) in a tri-layer configuration. A oscillatory decay characteristic of the pair wavefunction is expanded by using materials for the ML with a low Curie temperature and a small exchange field. As a result, the sum magnetic field of the alternetingly parallel and anti-parallel magnetized ML changes the critical temperature of the superconductor below and above the operational device temperature such that a passing read pulse remains unaltered at one of the two logical conditions stored within the device.

17 Claims, 3 Drawing Sheets

SUPERCONDUCTING MAGNETORESISTIVE MEMORY ELEMENT USING CONTROLLED EXCHANGE INTERACTION

RELATED APPLICATION

This application is related to the provisional patent application Ser. No. 60/104,899 filed Oct. 20, 1998, which is hereby incorporated by reference.

This invention was developed with government support under a grant from DoD URI contract no.N000-92-J-1886. The government has certain rights in the invention.

FIELD OF THE INVENTION

The current invention relates to magnetoresistive nonvolatile memory elements. More specifically the invention relates to a method to alter a conductivity of a superconducting signal layer between a resistive and non-resistive state.

BACKGROUND OF THE INVENTION

Data storage devices become more and more the weak link due to the ever increasing operational speed of computers. Regular hard disk drives with their affiliated masses do not provide sufficiently low read and write access time and data transfer rates to meet the demands for intermediate and permanent information storage.

As a result, random access memory (RAM) has been developed, that takes on the task of temporary information storage. Modern operating systems are designed to fulfill multiple operations quasi simultaneously, an ability commonly referred to as multitasking. Since the central processor unit (CPU) of a conventional computer has a limited processing capacity, multitasking is mainly performed in a serial mode. A number of temporary files is thereby created that have to be accessed altered repeatedly. All this happens in very short time intervals such that it appears simultaneously to an operator. RAM with its short access time and high data transfer rates makes it predestinated to accomplish the intermediate data storing.

The fast progressing development of RAM brings their storing capacity more and more close to that of hard disk drives and they become attractive to be used also for permanent data storing. Since conventional RAM operates after the principles of a transistor it needs power supply to keep the stored data. This characteristic is the main obstacle to utilize conventional RAM as a permanent storage device. To bypass this problem, magnetic random access memory (MRAM) is being developed as for instance giant magnetoresistive memory devices and others. Giant magnetoresitive memory devices typically utilize a memory cell consisting out of a magnetoresistive signal layer and two magnetized layers that can be magnetized either in same or in opposing direction. The two individual magnetizations sum thereby to either a maximum or to a minimum and alter the resistance of the adjacent signal layer correspondingly. The resistance level in the signal layer is utilized to retrieve an information about the magnetic state of the two magnetic layers induced during a writing operation.

The utilized magnetic materials have a certain magnetic persistence to assure the storage state over a sufficient time period.

Unfortunately the operating principle of giant magnetoresitive memory devices provides inconsistent levels of the retrieved signals. There mainly to reasons for that: 1) the highly proportional dependency of the resistance level in the signal layer to the sum magnetic field of the two magnetoresistive layers. This is for instance caused by material inconsistencies or by declining magnetic field strength. 2) The memory cells have to be arrayed in matrices with increasing size to provide sufficient storage capacity. With increasing sizes, resistance in the support lines is also increasing, which alters the write efficiency resulting in lower initial magnetic field strength. A read signal sent via the extended support lines is additionally affected by the increased resistance.

Therefore exists a need for a magnetoresistive memory element, that provides a stabile signaling level independent of the varying length of the support lines. The current invention addresses this need, in particular for application in combination with cuperconducting logic circuits.

The U.S. Pat. No. 5,276,639 discloses a superconductor magnetic memory cell and method for accessing the same. The invention discloses a memory cell operating similar to the configuration of the giant magnetoresistive memory element. The main difference is that it utilizes the Josephson junction instead of a conventional resistive signal layer to recognize the level of summed magnetic field. Separate support lines responsible for the write operation are superconductors. The Josephson Junction placed atop the magnetoresistive layers has an increased sensitivity, which results together with the resistance free condition in the support lines to an improved performance characteristic of a MRAM built according to the principles of this invention. Never the less, the proportional dependency between field strength of the sum magnetic field and the signal level in the SMS Josephson junction remains as a hampering influence. In addition, the Josephson Junction adds significantly complexity to the memory cell.

Therefore exists a need for a simple magnetoresistive memory element that utilizes the principles of a Josephson Junction and retrieves a signal highly independent of magnetic field strength variations in the magnetoresistive layers. The current invention addresses this need.<

M. G. Forrester, J. X. Przybysz, J. Talvacchio, J. Kang, A. Davidson, J. R. Gavalar disclose in the IEEE, Trans. Appl. Supercon, 5, 3401 (1995) a Josephson Junction memory circuit based on fluxoid quantization. Following the principles disclosed in this paper only relatively small memories were sucessfully fabricated.

Therefore, alternative memory concepts are needed that allow the fabrication of large MRAM devices. The current invention addresses this need.

OBJECTS AND ADVANTAGES

Accordingly, it is a primary object of the present invention to provide a nonvolatile magnetoresistive memory element that utilizes principles according to the superconductor/ferromagnet proximity effect.

It is another object of the present invention, to provide a read signal leveled independently of magnetic field strength variations of the sum magnetic field.

It is a further object of the present invention, to provide a memory concept based on principles of superconductivity, that allow the fabrication of large sized memories.

SUMMARY OF THE INVENTION

The invention utilizes the superconducting/magnetic metal proximity effect (SMPE) to change the critical temperature in the superconductor below or above an operational temperature of the device. Above the critical temperature the superconductor turns into a regular resistive conductor that attenuates a passing read signal according to ohm's law. Below the critical temperature the superconductor remains its superconducting properties up to a critical current flow.

In ferromagnetic materials the SMPE is predicted to occur with an oscillatory decay of the pair wavefunction, compared to a typically exponential decay for nonferromagnetic materials. The invention provides a theoretical analysis of the parameters, which are responsible for the decay length. It is favorable to have the decay length to a maximum in order to increase the critical bandwidth in relation to the achievable sum magnetic field variation. A sum parameter is introduced that combines the predicted required characteristics of favorable ferromagnetic layer material. These required characteristics are mainly a low Curie temperature or equivlently a low exchange field.

An inventive memory element utilizing the oscillatory decay has a design schema very similar to a regular giant magnetoresistive memory element (GME) as it is well known to those skilled in the art. Magnetic fields are induced by a x-conductor and a y-conductor onto the ferromagnetic layers. They are magnetized such that their resulting field sums to either a high sum magnetization or a low sum magnetization according to the status of the write signal. Different levels of the sum magnetization versus difference magnetization change details of the decaying oscillations in the combined magnetic layers. As a result, the critical temperature changes through the action of the proximity effect.

The memory device is operated at a temperature within the critical temperature bandwidth and is typically around 10K. A typical critical temperature bandwidth is predicted with approximately 2K to 3K.

In a supporting circuitry a signal pulse is provided via the x-conductor and the y-conductor. Due to the low operation temperature the x-conductor and y-conductor are preferably superconductive. The write signal pulse remains below the critical current level, at which the superconductivity would get lost. X-conductor and y-conductor are orthogonal to bundle the magnetic fields within the ferromagnetic layers as it is well known to those skilled in the art. The ferromagnetic layers have a magnetic persistence and a coercive force low enough to be overturned by the resulting magnetic field of the signal pulse. The orthogonal orientation and overturning the existing magnetic orientation reduce the efficiency of the conversion from the electric energy of the write signal pulse into the resulting magnetic energy.

The ferromagnetic layers are magnetized either parallel or anti-parallel. They remain under this condition until a second signal pulse with different poling induces a reverting magnetic field onto one ferromagnetic layer.

A read signal pulse is provided by the supporting circuitry with a read current level below the critical level of the superconductor in the eventual condition of superconductivity.

In case, the sum magnetization is at its low level, the superconductor has a critical temperature above the operational temperature and is thus superconductive. The read signal pulse passes then through without being attenuated. It is again received from the supporting circuitry, which recognizes its non attenuated level as a first information status. The magnetic persistence of the ferromagnetic layers is high enough to withstand the magnetic field induced by the passing read signal pulse.

In case the sum magnetization is at its high level, the superconductor has a critical temperature below the operational temperature and is thus resistive. The read signal pulse passes then through and is attenuated. It is again received from the supporting circuitry, which recognizes its attenuated level as second information status. The signal margin between the non attenuated and attenuated level is independent from the sum magnetization variation. In fact, the read signal margin is at a level, at which it compensates for all losses in the transition of the write signal energy into the stored magnetic energy. Due to this advantageous characteristic, the memory device can operate on relatively low levels, which results in small cell dimensions, reduced Johnson noise, and high memory densities.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
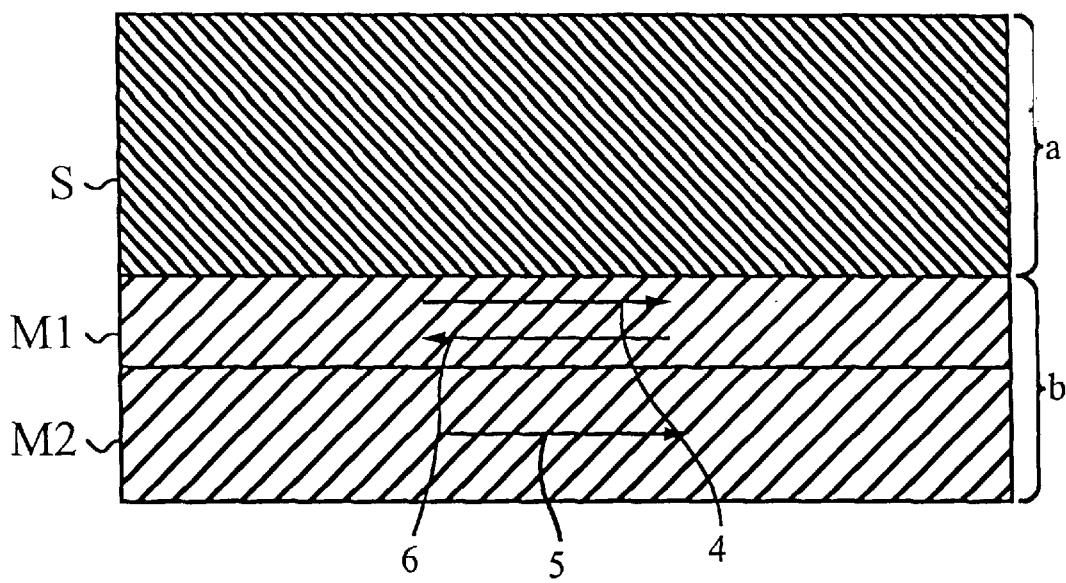
FIG. 1 shows a schematic section view of the invention.

A preferred embodiment of the inventive memory element is shown in FIG. 1. A superconducting layer S is placed atop a primary ferromagnetic layer M1 and a secondary ferromagnetic layer M2. It is appreciated that anybody skilled in the art may alter the arrangement of S, M1 and M2 relative to each other without diverting from the scope of the invention. M1 and M2 are of a ferromagnetic material and magnetized according to the principles of a giant magnetoresistive memory device (GMR) as it is known to those skilled in the art.

S has a layerthickness a, the magnetic layers M1 and M2 have total a layer thickness b. The primary magnetization of M1 is switched between a first primary direction FPD illustrated by the arrow 4 and a second primary direction SPD illustrated by the arrow 6. M2 has a secondary magnetization that remains with its secondary direction SD illustrated by the arrow 5 constant during the operational use of the memory element. The primary magnetic field and the secondary magnetic field sum to a sum magnetization (SMF). FPD together with SD result in a low level (LL) of SMF. SPD together with SD result in a high level (HL) of SMF.

M1 and M2 are of ferromagnetic materials with a low Curie temperature, low exchange field and low spin orbit scattering. This characteristic is fulfilled by favorable ferromagnetic materials of low atomic number Z as it is known to those skilled in the art. The spin orbit scattering in M1 and M2 is kept thereby to a low level. Favorable ferromagnetic materials are predicted to be for instance iron/cobalt based alloys.

An exchange interaction (EI) between S on one side and M1 and M2 on the other side takes place in the memory element. The EI works according to the proximity effect as it is well known to those skilled in the art. The invention exploits this proximity effect by using the favorable ferromagnetic materials such that the decay characteristic of the proximity effect becomes oscillatory with an extended decay length (EDL). The EDL is reduced by the SMF dependent on its strength, such that the EDL remains high at LL and goes low at HL.

The pair wavefunction in a superconductor is well known to those skilled in the art for influencing the critical temperature TC, at which the superconductor loses its superconductivity. The EI is based on the pair wavefunction such that the EDL affects TC. As a result, TC is correspondingly to LL and HL.

Thus, by having EDL at the predicted high level, the bandwidth of TC is stretched sufficiently beyond the variation of the memory element's operational temperature TCO. A typical TCO is 10K, a typical TC is predicted to be between a low level (TCL) of approximately 8.5K and a high level (TCH) of approximately 11.5K. At TCH the superconductor remains its superconductive properties, at TCL it turns into a regular resistive conductor.

SPD and FPD are induced on M1 in a write operation corresponding to the two logical cases of "0" and "1", according to the well known working principles of a GMR. Consequently LL, respectively HL and TCL, respectively TCH are also corresponding to the logical cases of "0" and "1". A read signal pulse passing through S remains therefore either in an unaltered condition (UC) during the superconductive state of S at TCH or remains in an altered condition (AC) as it is resistively reduced during the resistive state of S at TCL. UC and AC correspond to the logical cases of "0" and "1" stored in the memory element.

The relative level difference between UC and AC is independent of the relative level difference between TCL and TCH and is also independent of the relative level difference between LL and HL of SMF.

Figure 2:
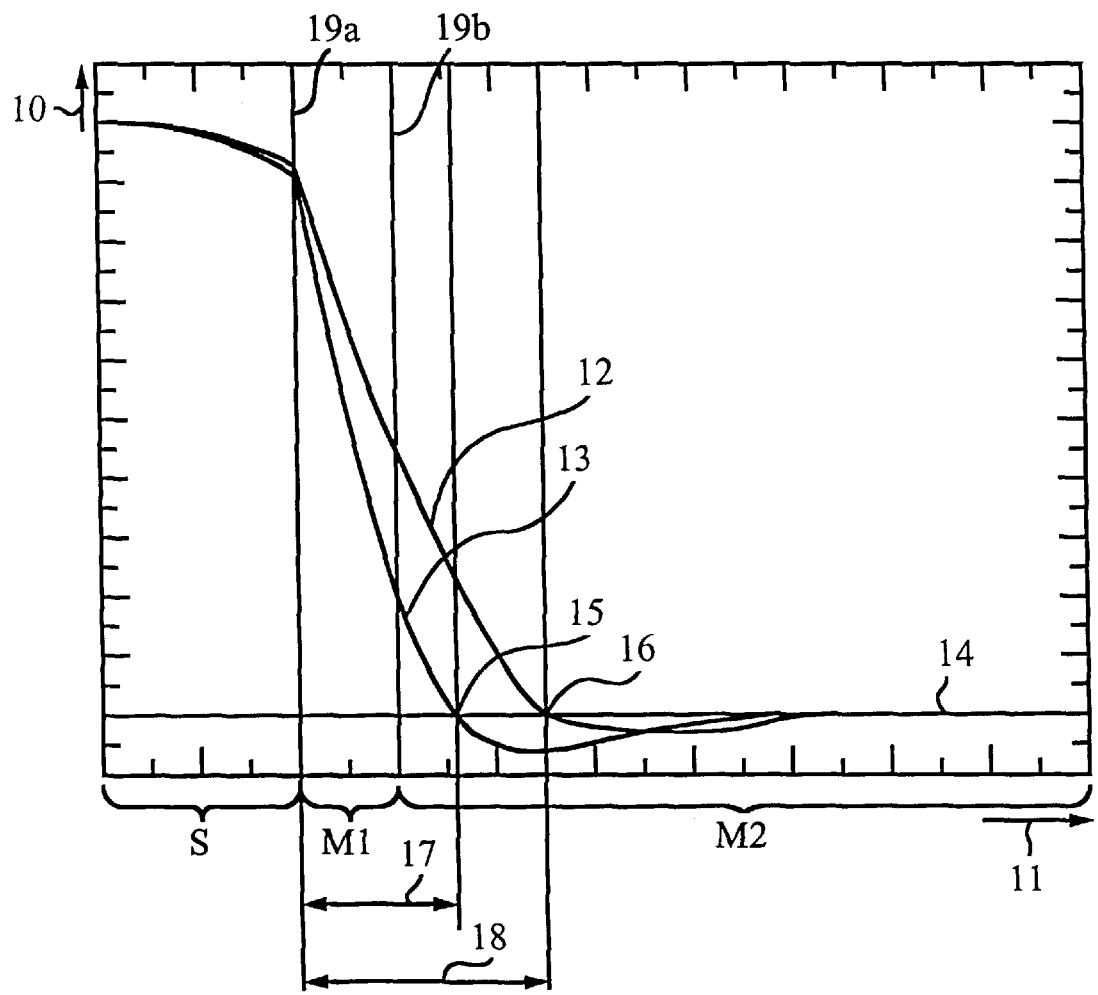
FIG. 2 shows a principle graph with the normalized pair wave function on its vertical axis and the device thickness over the coherence length for a favorable ferromagnetic material.

FIG. 2 shows the normalized pair wavefunction $$F(x) = \sum_\omega [f_-(\omega_1^x) + f_+(\omega_1^x)]$$

on the vertical axis 10 as a function of the normalized spatial coordinate $x/\xi_{s,m}$ on the horizontal axis 11. For convenience it is assumed that $\xi_s = \xi_m$ for this FIG. The coherence length $\xi_s$ corresponds to the superconducting coherence length of S, and $\xi_m$ corresponds to the coherence length of M1 and M2.

Hence the spatial coordinate is the ratio of the thickness of S, M1 and M2 over the coherence length.

The horizontal oriented S, M1 and M2 of FIG. 1 sre represented vertically in FIG. 2. The first vertical line 19a represents the boundary between S and M1 and the vertical line 19b represents the boundary between M1 and M2.

$$\xi_m = \sqrt{\frac{4\hbar D_m}{h}},$$

whereby $\hbar$ is the Plank constant, h the exchange energy and $D_m$ the diffusion constant for M1 and M2.

$$\xi_s = \sqrt{\frac{\hbar D_s}{2k\pi T_{CO}}},$$

whereby k is the Boltzman constant.

The first curve 12 shows exemplary the oscillatory decay for LL of SMF and second curve 13 shows exemplary the oscillatory decay for HL of SMF. First curve 12 reaches the zero line 14 at the first zero mark 15 and in the first decay distance 17, second curve 13 reaches the zero line 14 at the second zero mark 16 and in the second decay distance 18. The first mark distance 17 anddecay destance 18. For purpose of visualization and theoretical analizes of the curves 12, 13 M2 is assumed to be quasi infinite.

Figure 3:
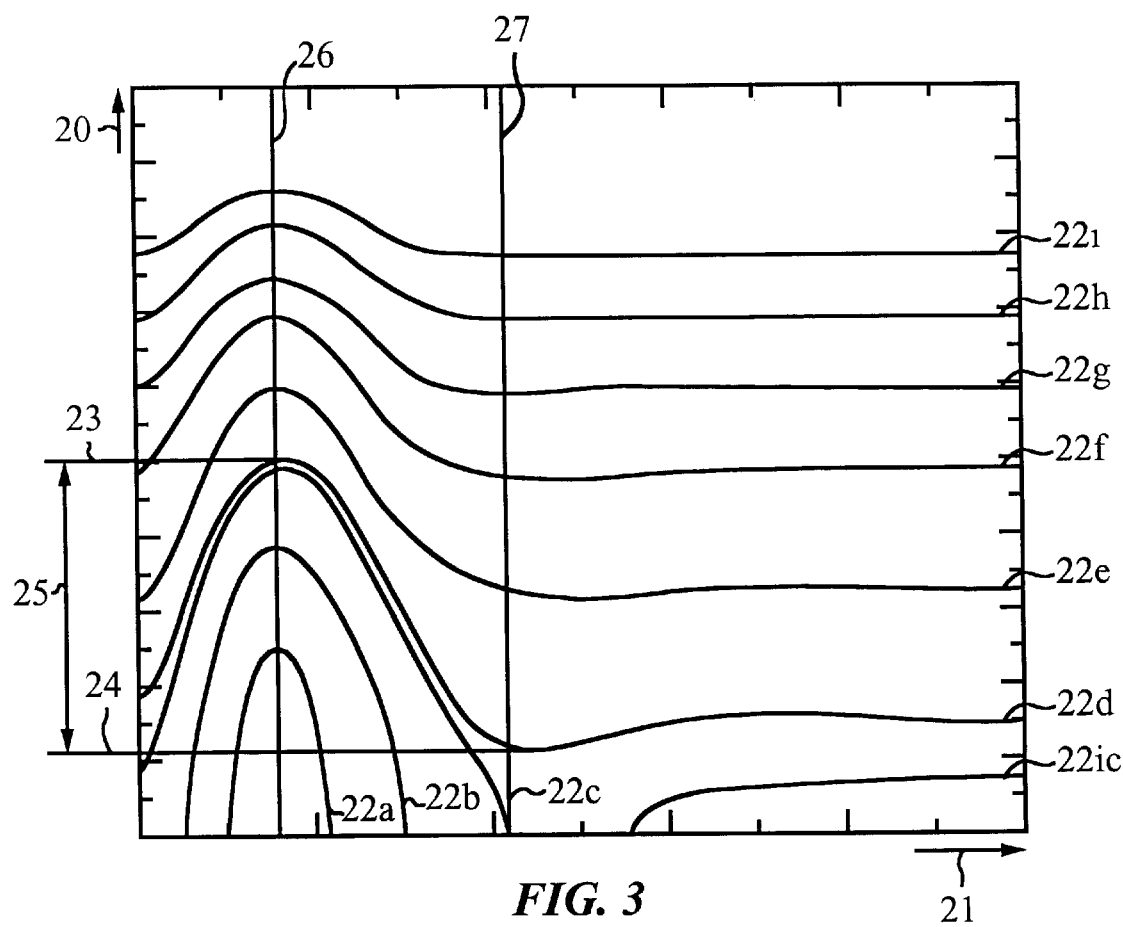
FIG. 3 shows a principle graph with the operation temperature over the critical temperature on its vertical axis and the ferromagnetic layer thickness over its coherence length on its horizontal axis. Conditions described in the graph are for a favorable ferromagnetic material. The curves represent in the graph various ratios of the superconductor layer thickness over its coherence length. The sum magnetization for this graph is on its low level.

FIG. 3 shows the influence on TC relative to TCO by layer thickness d1 of M1 over $\xi_m$ for various primary ratios of a over $\xi_s$. The vertical axis 20 represents TC over TCO, the horizontal axis 21 represents d1 over $\xi_m$. The curves 22a–i represent various primary ratios in a typical range between 0.5 at curve 22a and 2.0 at curve 22i. The curve 22d has the vertical discrepancy 25 at a maximum between high mark 26 and low mark 27. The vertical discrepancy 25 represents the maximum predicted bandwidth of TC relative to TCO achievable with a given a over $\xi_s$ and varying d1 over $\xi_m$. The upper level 23 corresponds to the predicted approximate 11.5K for TCH and the lower level 24 corresponds to the predicted approximate 8.5K for TCL.

The memory element is optimized when d1, the layer thickness d2 of M2, and a are defined relative to each other such that high mark 26 is at the same physical depth of M1 as second zero mark 16 and such that low mark 27 is at the same physical depth of M1 as first zero mark 15.

Figure 4:
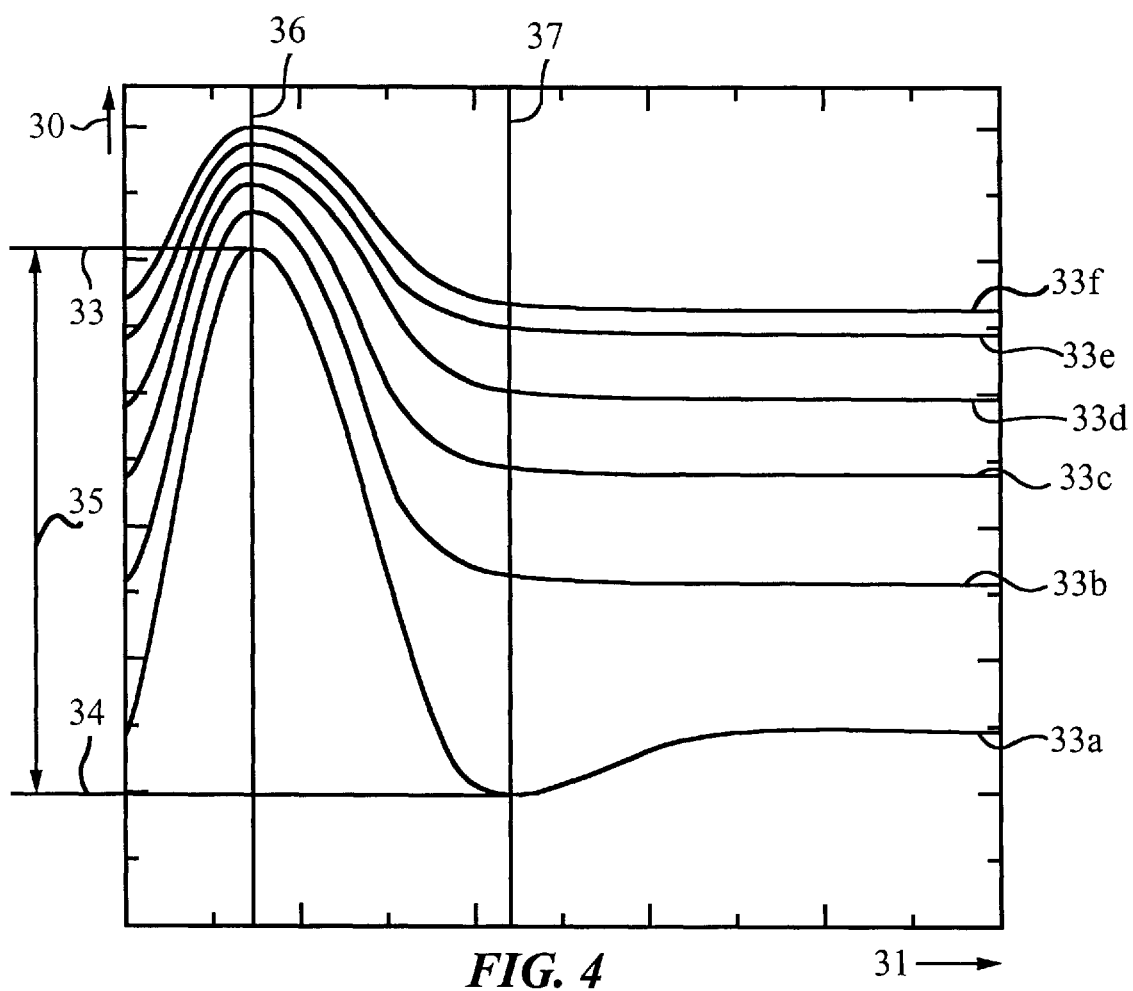
FIG. 4 shows a principle graph with the operation temperature over the critical temperature on its vertical axis and the ferromagnetic layer thickness over its coherence length on its horizontal axis. Conditions described in the graph are for a favorable ferromagnetic material. The curves represent in the graph various spin orbit scattering rates for a given ratio of superconductor thickness over its coherence length.

FIG. 4 shows the influence on TC relative to TCO by d1 over $\xi_m$ for various exchange fields. The vertical axis 30 represents TC over TCO, the horizontal axis 31 represents d over $\xi_m$. The curves 32a–f represent various exchange field relative to the spin orbit scattering rate (SOSR) in a typical theoretical range between 0 at curve 33a and 0.99 at curve 33f. The curve 32a has the second vertical discrepancy 35 at a maximum between second high mark 36 and second low mark 37. The second vertical discrepancy 35 represents the maximum predicted bandwidth of TC relative to TCO achievable with a given exchange field relative to SOSR and a given d1 over $\xi_m$. The upper level 33 corresponds to the predicted approximate 11.5K for TCH and the lower level 34 corresponds to the predicted approximate 8.5K for TCL.

The memory element is optimized when d1, the layer thickness d2 of M2, and a are defined relative to each other such that second high mark 36 is at the same physical depth of M1 as second zero mark 16 and such that second low mark 37 is at the same physical depth of M1 as first zero mark 15.

Accordingly, the scope of the invention should be determined by the following claims and their legal equivalents:

What is claimed is:

1. A magnetoresistive memory device for changing a superconductor layer between a resistive state and a non resistive state, said magnetoresistive memory device comprising:

A) a temperature providing means providing an operation temperature to said superconductor layer within a critical temperature bandwidth of said superconductor layer;

B) a primary ferromagnetic layer adjacent to said superconductor layer, said primary ferromagnetic layer having a primary magnetization;

C) a secondary ferromagnetic layer adjacent to said primary ferromagnetic layer, said secondary ferromagnetic layer having a secondary magnetic field summing with said primary magnetization to a sum magnetization having a high level alternating with a low level; and wherein said resistive state and said non-resistive state correspond to said high level and said low level within said critical temperature bandwidth accordingly to principles of a superconductor/ferromagnet proximity effect.

2. A magnetoresistive memory device of claim 1, wherein said primary magnetization is induced by a primary magnetizing means.

3. A magnetoresistive memory device of claim 2, wherein said primary magnetizing means derived from a signal current pulse in a superconducting control line.

4. A magnetoresistive memory device of claim 3, wherein said primary magnetizing superconductor has a primary critical magnetic write field capability.

5. A magnetoresistive memory device of claim 4, wherein said critical magnetic write field is at a level to overcome a primary magnetic persistence and a primary coercive force of said primary ferromagnetic layer.

6. A magnetoresistive memory device of claim 1, wherein said secondary magnetization is induced by a secondary magnetizing means.

7. A magnetoresistive memory device of claim 6, wherein said secondary magnetizing means is derived from a signal current pulse in a superconducting control line.

8. A magnetoresistive memory device of claim 7, wherein said secondary magnetizing superconductor has a secondary critical magnetic write field capability.

9. A magnetoresistive memory device of claim 8, wherein said secondary critical magnetic write field is at a level to overcome a secondary magnetic persistence and a secondary coercive force of said secondary ferromagnetic layer.

10. A magnetoresistive memory device of claim 1, wherein said superconductive layer has a critical magnetic read field.

11. A magnetoresistive memory device of claim 1, wherein said at primary ferromagnetic layer and said secondary ferromagnetic layer have a magnetic read persistence and a coercive read force.

12. A magnetoresistive memory device of claim 11 wherein said magnetic read persistance withstands a magnetic field of said critical magnetic read field.

13. A magnetoresistive memory device of claim 11, wherein said read coercive force is at a level to withstand said critical magnetic read field.

14. A magnetoresistive memory device of claim 1, wherein said at primary ferromagnetic layer and said secondary ferromagnetic layer have a curie temperature and an exchange field.

15. A magnetoresistive memory device of claim 14, wherein said curie temperature sums from said operation temperature, a maximum temperature variation between parallel and antiparallel magnetization states of the two magnetic layers and a safety temperature margin.

16. A method for non volatile changing a superconductor layer between a permanent resistive state and a permanent non resistive state by providing a critical temperature of said superconductor layer at a first level above an operation temperature of said superconductor layer alternating with a second level below said operation temperature, said first corresponding to said permanent resistive state and said second level corresponding to said permanent non resistive state in accordance to principles of a superconductor/ferromagnetic proximity effect, and wherein said first level being induced by a low sum magnetization and said second level being induced by a high sum magnetization.

17. A method for providing a signal margin of a read signal of a magnetoresistive memory element independent to a write signal energy induced to said magnetoresistive memory element by exposing a superconductor layer to a low sum magnetization alternating with a high sum magnetization and correspondingly defining a high critical temperature above an operation temperature of said superconductor together with a resistive state of said superconductor layer alternating with a low critical temperature below said operation temperature together a non resistive state of said superconductor layer, whereby at least one of said low sum magnetization and said high sum magnetization is defined by said write signal energy and said read signal margin is defined by said resistive state and said non resistive state in accordance to principles of a superconductor/ferromagnetic proximity effect.

* * * * *